US006165691A

United States Patent [19]

Damme et al.

[11] Patent Number: 6,165,691

[45] **Date of Patent: *Dec. 26, 2000**

[54] METHOD FOR LITHOGRAPHIC PRINTING BY USE OF A LITHOGRAPHIC PRINTING PLATE PROVIDED BY A HEAT SENSITIVE NON-ABLATABLE WASTELESS IMAGING ELEMENT AND A FOUNTAIN CONTAINING WATER-INSOLUBLE COMPOUNDS

[75] Inventors: Marc Van Damme, Heverlee; Johan Van Hunsel, Alken; Johan Vermeersch, Deinze; Peter Hendrikx, Hamont-Anchel, all of Belgium

[73] Assignee: Agfa-Gevaert, N.V., Mortsel, Belgium

[ * ] Notice: This patent is subject to a terminal disclaimer.

[21] Appl. No.: 09/212,392

[22] Filed: Dec. 16, 1998

Related U.S. Application Data

[60] Provisional application No. 60/074,133, Feb. 9, 1998.

[30] Foreign Application Priority Data

Dec. 19, 1997 [EP] European Pat. Off. .............. 97204044

[51] Int. Cl.[7] .............. G03F 7/004

[52] U.S. Cl. .............. 430/303; 101/467; 430/331

[58] Field of Search .............. 430/302, 303, 430/323, 325, 331, 281.1; 101/467

[56] References Cited

U.S. PATENT DOCUMENTS

| | | | |
|---|---|---|---|
| 4,238,279 | 12/1980 | Tsubai et al. | 156/664 |
| 4,530,721 | 7/1985 | Kinderman et al. | 106/2 |
| 5,658,708 | 8/1997 | Kondo | 430/288.1 |
| 5,741,619 | 4/1998 | Aoshima et al. | 430/175 |

*Primary Examiner*—Janet Baxter
*Assistant Examiner*—Barbara Gilmore
*Attorney, Agent, or Firm*—Breiner & Breiner

[57] ABSTRACT

According to the present invention there is provided a method for lithographic printing comprising the following steps:

preparing a lithographic printing plate by image-wise laser exposing a heat-sensitive non-ablatable wasteless imaging element comprising a compound capable of transferring light into heat and having on a support as top layer a heat sensitive image forming layer comprising a heat-switchable binder which layer becomes more hydrophilic or more hydrophobic under the action of image-wise laser exposure;

mounting said printing element on the press prior to or after the exposure; and applying a fountain solution and ink, characterized in that said fountain solution comprises at least one water insoluble compound selected from the group consisting of silica, alumina, titanium oxide, tin oxyde, china clay, smectic clay and zirconium oxide.

7 Claims, No Drawings

METHOD FOR LITHOGRAPHIC PRINTING BY USE OF A LITHOGRAPHIC PRINTING PLATE PROVIDED BY A HEAT SENSITIVE NON-ABLATABLE WASTELESS IMAGING ELEMENT AND A FOUNTAIN CONTAINING WATER-INSOLUBLE COMPOUNDS

This application claims the benefit of Provisional Application 60/074,133 filed Feb. 9, 1998.

FIELD OF THE INVENTION

The present invention relates to a method for lithographic printing by use of a lithographic printing plate provided by a heat sensitive non-ablatable wasteless imaging element and a fountain containing water-insoluble compounds.

BACKGROUND OF THE INVENTION

Lithography is the process of printing from specially prepared surfaces, some areas of which are capable of accepting lithographic ink, whereas other areas, when moistened with water, will not accept the ink. The areas which accept ink define the printing image areas and the ink-rejecting areas define the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are exposed in contact through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the above mentioned photosensitive coatings are not sensitive enough to be directly exposed to a laser. Therefor it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A- 60-61 752 but has the disadvantage that a complex development and associated developing liquids are needed.

GB-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower dot crispness. The trend towards heat mode printing plate precursors is clearly seen on the market.

EP-A-444 786, JP-63-208036, and JP-63-274592 disclose photopolymer resists that are sensitized to the near IR. So far, none has proved commercially viable and all require wet development to wash off the unexposed regions. EP-A-514 145 describes a laser addressed plate in which heat generated by the laser exposure causes particles in the plate coating to melt and coalescence and hence change their solubility characteristics. Once again, wet development is required.

A somewhat different approach is disclosed in U.S. Pat. No. 3,787,210, U.S. Pat. No. 3,962,513, EP-A-001 068 and JP-04-140191. Heat generated by laser exposure of a donor sheet is used to physically transfer a resinous material from the donor to a receptor held in intimate contact with the donor. Provided the receptor surface has suitable hydrophilic properties, it can then be used as a printing plate. This method has the advantage of not requiring wet processing, but in order to achieve realistic write-times, a high power YAG (or similar) laser is required, which has restricted the usefulness of the method On the other hand polymer coatings which undergo a change in surface properties in response to light exposure are known in the art. WO-92/09934 discloses imaging elements including coatings that become hydrophiliic as a result of irradiation, and WO-92/02855 describes coatings that become tacky as a result of irradiation. In both cases, the coatings comprise an acid-sensitive polymer and a photochemical source of strong acid, and in both cases the preferred acid-sensitive polymer is derived from a cyclic acetal ester of acrylic or methacrylic acid, such as tetrahydropyranyl (meth)acrylate.

WO-92/02855 discloses that the acid-sensitive polymer is blended with a low-Tg polymer to produce a coating that is initially non-tacky, but on irradiation undergoes phase separation as a result of chemical conversion of the acid-sensitive polymer, and becomes tacky. Although the possibility of laser exposure is mentioned, no details are given, and there is no disclosure of IR-sensitivity, only UV/visible. However the same materials were the subject of a paper entitled "Advances in Phototackification" presented as Paper 1912–36 at the 1993 IS & T/SPIE Conference , Symposium on Electronic Science and Technology, in which it was further disclosed that the photoacid generator could be replaced by an IR dye (specifically a squarilium dye with thiopyrylium end groups) and exposure effected with a diode laser device. The dye in question is not known to have acid-generating properties. This technology is the subject of U.S. Pat. No. 5,286,604.

WO-92/09934 discloses that an acid-sensitive polymer is optionally blended with one or more photoacid generators. Subsequent to imagewise exposure to UV/visible radiation, the exposed areas are preferentially wettable by water, and the coatings may function as lithographic printing plates requiring no wet processing. There is no disclosure of laser address. EP-A-652 483 discloses a lithographic printing plate requiring no dissolution processing which comprises a substrate bearing a heat-sensitive coating, which coating becomes relatively more hydrophilic under the action of heat Said. system yields a positive working printing plate. No specific fountain solution is mentioned. An analogous system, however yielding a negative working printing plate is disclosed on this same day by the same inventors.

DE-1 105 439 discloses a fountain solution for lithographic printing, characterized by an amount of very fine dispersed silicium dioxide or very fine dispersed mixed oxides of silicium dioxide and aluminiumoxide.

EP-A-652 483 discloses a lithographic printing plate requiring no dissolution processing which comprises a substrate bearing a heat-sensitive coating comprising a photothermal converter, which coating becomes relatively more hydrophilic under the action of heat.

GB-A-2 008 495 discloses a treating liquid composition for treating the surface of lithographic printing plates which comprises (a) at least one phosphoric acid, (b) nitric acid and /or at least one salt thereof and (c) nitrous acid and/or at least one salt thereof.

U.S. Pat. No. 4,081,572 discloses a method for preparing a printing master comprising (a) providing a self-supporting master substrate, (b) providing a specific hydrophilic polymer, © coating said substrate with said polymer , and (d) selectively thermally converting said polymer to a hydrophobic condition in image configuration.

OBJECTS OF THE INVENTION

It is an object of the invention to provide prints from a lithographic printing plate obtained by image-wise laser exposure of a heat-sensitive non-ablatable wasteless imaging element having on a support as top layer an image forming layer which becomes more hydrophilic or more hydrophobic under the action of image-wise IR-laser exposure giving a good ink acceptance in the image areas and no ink acceptance in the non-image areas. Further objects of the present invention will become clear from the description hereinafter.

SUMMARY OF THE INVENTION

According to the present invention there is provided a method for lithographic printing comprising the following steps:

preparing a lithographic printing plate by image-wise laser exposing a heat-sensitive non-ablatable wasteless imaging element comprising a compound capable of transfering light into heat and having on a support as top layer a heat sensitive image forming layer comprising a heat-switchable binder which layer becomes more hydrophilic or more hydrophobic under the action of image-wise laser exposure;

mounting said printing element on the press prior to or after the exposure; and applying a fountain solution and ink, characterized in that said fountain solution comprises at least one water insoluble compound selected from the group consisting of silica, alumina, titanium oxide, tin oxyde , china clay, smectic clay and zirconium oxide.

DETAILED DESCRIPTION OF THE INVENTION

Preferably the number average size of the water insoluble compound ranges from 0.005 $\mu$m to 0.05 $\mu$m. Preferentially a concentrated dampening solution comprises said water insoluble compound in an amount between 1 g and 30 g, more preferably between 2.5 g/l and 20 g/l. A preferred water insoluble compound is silica.

Concentrated fountain or dampening solutions suitable for use in the present invention are aqueous solutions comprising water-soluble organic solvents. Examples of such water-soluble organic solvents include alcohols, polyhydric alcohols, ethers, polyglycols and esters.

Examples of the alcohols include n-butyl alcohol, n-amyl alcohol, n-hexyl alcohol, 2-methylpentanol-1, secondary hexyl alcohol, 2-ethylbutyl alcohol, secondary heptyl alcohol and heptanol-3,2-ethylhexyl alcohol.

Examples of the polyhydric alcohols include ethylene glycol, hexylene glycol, octylene glycol, diethylene glycol and glycerol. Examples of the ethers include ethylene glycol monoethyl ether, ethylene glycol mono-n-hexyl ether, ethylene glycol monophenyl ether, ethylene glycol mono-2-ethylbutyl ether, diethylene glycol monoethyl ether and diethylene glycol mono-n-hexyl ether.

Examples of the esters include diethylene glycol monoethyl ether acetate and diethylene glycol monobutyl ether acetate.

Examples of polyglycols include polyethyleneglycols having an average molecular weight of 400 to 2000, polypropylene glycols having an average molecular weight of 400 to 2000, and block copolymers of ethylene glycol and propylene glycol.

The dynamic surface tension of the concentrated dampening solution is lowered by adding said organic solvents. A concentrated dampening solution according to the invention has preferably a dynamic surface tension range from 25 to 50 dyne/cm at 15° C. when measured at most 1*10-1 second after a surface of said solution is formed on the surface of a printing plate with the NOW-INSTANT WILHELMY DYNAMIC SURFACE TENSION ACCESSORY manufactured by Cahn Co, U.S.A.

The concentrated dampening solutions used in the present invention may contain from about 0.05 to 30%, preferably from 0.1 to 25%, more preferably from 1 to 20% by weight of these water-soluble organic solvents.

According to the invention the concentrated dampening solutions have a pH comprised between 3 and 6, more preferably between 4 and 6. Therefore said concentrated dampening solution comprises a buffer salt, preferably a phosphate salt. The amount of the buffer salt lies preferably between 3 and 30 g/l, more preferably between 6 and 25g/l.

The concentrated dampening solution preferably comprises also, in order to further improve its stability citrate ions in a total concentration between 0.5 mmole and 25 mmole, more preferably between 1 mmole and 20 mmole, most preferably between 1.5 mmole and 15 mmole. The term "total concentration of citrate anions" represents the sum of the concentrations of citric acid and its salts regardless of their ionic charge.

The concentrated dampening solution preferably also contains one or more polymers selected from the group consisting of polymethacrylic acid or one of its salt, polyacrylic acid or one of its salt, polydextrane, polyvinylalcohol, polyvinylpyrrolidone, polyacrylamide, polyvinylsulphonic acid or one of its salts and gum arabic. Said polymers are used in an amount between 0.1. g/l and 5.0 g/l.

Surfactants can be added to the concentrated dampening solution to increase the emulsification ratio in ink. The contents of these surfactants should not be higher than 1% by weight, preferably 0.0001 to 0.3% by weight when foaming is taken into consideration.

The concentrated dampening solution used in the present invention may also comprise thickening agents. Examples of thickening agents which can be used in the present invention include water-soluble cellulose derivatives, alginate and derivatives, gum, water-soluble modifications of starch, and water-soluble high-molecular homopolymers and copolymers. These compounds may be used either alone or as a mixture of two or more of them.

The concentration varies depending on the type of the thickening agents, but is preferably about 0.00005 to 1% by weight based on the amount of the dampening solution composition.

In general, the concentrated dampening solution used in the present invention comprises a (combination of) preservative(s), so that the composition is effective for controlling various kinds of mold, bacteria and yeast.

In addition to the above-described components, the concentrated dampening solution of the present invention may contain chelate compounds preferably in an amount of 0.00001 to 0.3% by weight based on the amount of the dampening solution and corrosion inhibitors preferably in an amount of 0.000001 to 0.5% by weight.

The concentrated dampening solution as described above is diluted with sufficient tap water or well water prior to being applied on the plate. The concentrated dampening solution is used on the printing press in a 1:100 to 10:100 dilution, preferably in a 2:100 to 6:100 dilution.

The dampening solution can be used alone or in combination with water-soluble organic solvents e.g. isopropanol or substitutes therefore.

The image forming layer which becomes more hydrophobic or hydrophilic under the influence of IR-irradiation comprises a heat-switchable binder and optionally a compound capable of transfering light into heat. A heat-switchable binder is a polymer or copolymer which under the influence of heat undergoes a polarity transfer from hydrophilic to hydrophobic or vice versa.

In one embodiment the heat-switchable binder undergoes a polarity transfer from hydrophobic to hydrophilic. Said polymer has preferably pendant hydrophobic groups which are converted under the action of heat to hydrophilic groups. More preferably said pendant groups are selected from the group comprising t-alkyl carboxylates, t-alkyl carbonates, benzylcarboxylates and alkoxyalkyl esters. More details are given in EP-A-652 483.

In a more preferred embodiment the heat-switchable binder undergoes a polarity transfer from hydrophilic to hydrophobic.

The image forming layer which becomes more hydrophobic under the influence of heat comprises a heat-switchable binder and optionally a compound capable of transferring light into heat. According to the preferred embodiment a switchable binder is used which is hydrophilic before heating and becomes hydrophobic by heating. This surface polarity difference is sufficient to prepare a classical offset printing plate. Preferably the switchable binders according to the preferred embodiment are polymers or copolymers which contain pendant polar functions. These polar functions may be carboxylic acids, sulphonic acids, phosphonic acids and phenols or their salts. As counter ion can be used sodium, potassium, ammonium, or tetraalkylammonium ion. Also traces of alkali can be used such as traces of triethylamine and pyridine. These hydrophylic functions react under the influence of heat with other functional groups forming a hydrophobic structure.

A more preferred switchable binder according to the preferred embodiment is a binder containing maleic acid, which binder is hydrophilic and which yields under the influence of heat a binder containing maleic anhydride which binder is hydrophobic. Also more preferred switchable binders according to the invention are binders containing fumaric acid, itaconic acid, 3- or 4-vinylphthalic acid, cis-1,2,3,6-tetrahydrophthalic acid or cis-5-norbene-endo-2,3-dicarboxylic acid. Said acids can be mixed in one copolymer. Not only the diacids but also the monoalkyl esters and their salts are more preferred. Examples of such half-esters are monobutyl maleate copolymers, mono-isopropyl maleate copolymers, maleic acid 2-butoxy ethyl ester copolymer, maleic acid isobutylester copolymers and maleic acid isooctyl ester copolymers. These halfesters can also be used in combination with the corresponding dicarboxylic substance in one copolymer or they can be mixed with each other or with another dicarboxylic acid or salt into one copolymer.

Not only copolymers obtained by copolymerization of e.g. maleic acid but also polymers derivatives obtained by grafting e.g. maleic acid on unsaturated polyolefines are very suitable switchable polymers.

Preferably a switchable binder according to the preferred embodiment is a copolymer preferably containing an acrylate, a methacrylate, a vinyl halide, a vinyl ester, a vinyl ether such as n-butyl-, isobutyl-, and 2-chloroethyl vinyl ether and olefines such as propylene, isobutylene and 1-octadecene. More preferably is a compound selected from the group consisting of methyl vinylether copolymer, ethene copolymer and styrene copolymer. Most preferably said binder is a copolymer containing maleic acid and vinyl methyl ether.

The ratio of the dicarboxylic monomer to comonomer can be 100:0 to 20:80, or sufficient for its structure or state (i.e. anhydride or otherwise) to affect the overall solubility of the top layer. Typically the ratio is near 50:50 due to a tendency toward alternating copolymerization. The molecular weight is generally between 5,000 up to 70,000 weight average molecular weight, preferably between 10,000 and 40,000 g/mol.

The image forming layer may comprise more than one switchable polymer although that is not preferred. The image forming layer may also comprise a further binder to enhance the hydrophilic or hydrophobic properties of said layer.

As hydrophilic binder there may be used hydrophilic (co)polymers such as for example, homopolymers and copolymers of acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight. A preferred hydrophilic binder is polyvinylalcohol.

As hydrophobic binder there may be used a water insoluble polymer such as a cellulose ester, a copolymer of vinylidene chloride and acrylonitrile, poly(meth)acrylates and polyvinylchloride. Preferred hydrophobic binders are hydrophobic binders as used in conventional positive or negative working PS-plates e.g. novolac, polyvinyl phenols, carboxy substituted polymers etc. Typical examples of these polymers are descibed in DE-A-4 007 428, DE-A-4 027 301 and DE-A-4 445 820.

The image forming layer or a layer just underlying said layer includes a compound capable of converting light into heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared absorbing dyes and pigments and in particular infrared absorbing pigments. Examples of infrared absorbing dyes are disclosed in EP-A-97 203 131.4. Examples of infrared absorbing pigments are carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. Said compound capable of converting light into heat is preferably present in the top layer but can also be included in an underlying layer.

Said compound capable of converting light into heat is present in the imaging element preferably in an amount between 1 and 25% by weight of the total weight of the image forming layer, more preferably in an amount between 2 and 20% by weight of the total weight of the image forming layer. The compound capable of converting light into heat is most preferably present in the imaging element in an amount to provide an optical density at the wavelength between 800 nm and 1100 nm of at least 0.35.

Furthermore this image forming layer is preferably a visible light- and UV-light desensitised layer. This preferably visible light- or UV-light desensitised layer does not comprise photosensitive ingredients such as diazo compounds, photoacids, photoinitiators, quinone diazides, sensitisers etc. which absorb in the wavelength range of 250 nm to 650 nm. In this way a daylight stable printing plate can be obtained.

The image forming layer is preferably applied in an amount between 0.1 and 10 g/m$^2$, more preferably in an amount between 0.5 and 5 g/m$^2$.

The support may be as well a hydrophobic as a hydrophilic support and as well a rigid as a flexible support.

In the imaging element according to the present invention, the support can be an anodised aluminum. A particularly preferred support is an electrochemically grained and anodised aluminum support According to another embodiment in connection with the present invention, the support is a flexible support, such as paper or plastic film. As flexible support in connection with the present embodiment it is particularly preferred to use a plastic film e.g. substrated polyethylene terephthalate film, cellulose acetate film, polystyrene film, polycarbonate film etc. . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per m$^2$ and 750 mg per m$^2$. Further, the ratio of silica to hydrophilic binder is preferably more than 1 and the surface area of the colloidal silica is preferably at least 300 m$^2$ per gram, more preferably at least 500 m$^2$ per gram.

Between the support and the top layer the imaging element can contain other layers such as subbing layers and antihalo layers.

Irrespectively if the imaging element contains a dye according to the invention or not, the imaging element optionally contains between the support and the top layer a reflective layer. Said reflective layer can be any layer which reflects the IR-irradiation but is preferably aluminum with a high visual density e.g. vacuum deposited aluminum.

The imaging element can be prepared by applying the different layers according to any known technique. Alternatively said imaging element may be prepared on the press with the support already on the press by a coater or coaters placed in the immediate vicinity of the press.

For imaging in connection with the present invention an image-wise scanning exposure is used involving the use of a laser that preferably operates in the infrared or near-infrared, i.e. wavelength range of 700–1500 nm. Most preferred are laser diodes emitting in the near-infrared. Exposure of the imaging element can be performed with lasers with a short as well as with lasers with a long pixel dwell time. Preferred are lasers with a pixel dwell time between 0.005 $\mu$s and 20 $\mu$s.

After the exposure the imaging element is ready to be used as a lithographic printing plate.

In another embodiment of the invention the exposure of the imaging element can be carried out with the imaging element already on the press. A computer or other information source supplies graphics and textual information to the printhead or a laser via a lead.

The printing plate of the present invention can also be used in the printing process as a seamless sleeve printing plate. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

Where the inking and the dampening of the plate can occur at the same moment or the inking of the plate can even precede the application of the fountain solution to the plate , it is preferred to apply the fountain solution prior to inking the plate.

The following examples illustrate the present invention without limiting it thereto. Examples 1 and 2 demonstrate the use of the claimed method for an imaging element whereof the imaging layer becomes more hydrophobic on exposure while examples 3 and 4 demonstrate the use of the claimed method for an imaging element whereof the imaging layer becomes more hydrophilic on exposure. All parts and percentages are by weight unless otherwise specified.

EXAMPLE 1

0.35 g of GANTREZ AN 139 BF.(a copolymer of vinylmethylether, maleic acid and maleic acid anhydride, commercially available from GAF, USA) and 0.0365 g of IR-absorbing dye IR-1 are dissolved in 4.5 g of a solvent mixture consisting for 44% of THF, 34% of methoxypropanol and 22% of methyl ethyl ketone. Said solution was coated onto an aluminum substrate to a wet coating thickness of 16 μm resulting after drying in a dry layer with a thickness of 1.15 g/$m^2$.

This imaging element was exposed on a CREO 3244 Trendsetter (tradename of CREO, Canada) at 2400 dpi, operating at a drum speed of 40 rpm and a laser output of 12 watt.

After exposing the imaging element a printing plate is obtained, which was used to print on a AB Dick 360 press (trade name of AB Dick, USA) using K+E 800 ink (trade name of Kast und Ehinger)and water with 5% TAME EC 7035 (fountain solution containing no water insoluble compounds, commercially available from ANCHOR, USA). Scumming was observed in the non exposed areas.

IR-1

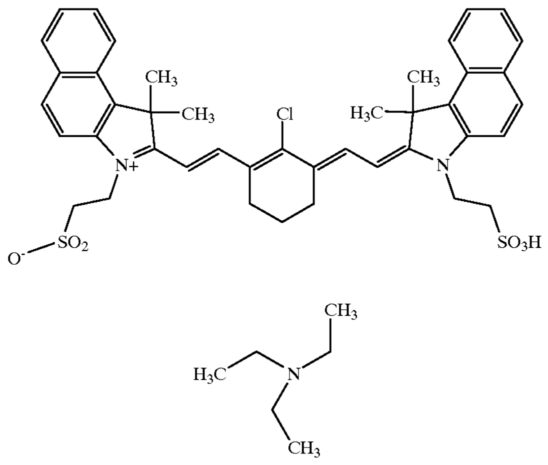

EXAMPLE 2

A printing plate prepared and imaged as the printing plate from example 1 was used to print on a AB Dick 360 press (trade name of AB Dick, USA) using K+E 800 ink (trade name of Kast und Ehinger) and water with 5% G 671c (silica containing fountain from Agfa-Gevaert, Belgium). Good prints were obtained, i.e. prints with good ink-uptake in the exposed areas and no scumming in the non-exposed areas.

EXAMPLE 3

0.35 g of a copolymer of tetrahydropyranylmethacrylate/methacryloxypropyltrimethoxysilane in a monomer ratio of 90:10 by weight and 0.0365 g of IR-absorbing dye IR-1 are dissolved in 4.5 g of a solvent mixture consisting for 60% of THF and 40% of methoxypropanol. Said solution was coated onto an aluminum substrate to a wet coating thickness of 16 μm resulting after drying in a dry layer with a thickness of 1.15 g/$m^2$.

This imaging element was exposed on a CREO 3244 Trendsetter (tradename of CREO, Canada) at 2400 dpi, operating at a drum speed of 40 rpm and a laser output of 12 watt.

After exposing the imaging element a printing plate is obtained, which was used to print on a AB Dick 360 press (trade name of AB Dick, USA) using K+E 800 ink (trade name of Kast und Ehinger) and water with 5% TAME EC 7035 (fountain solution containing no water insoluble compounds, commercially available from ANCHOR, USA). Scumming was observed in the exposed areas.

EXAMPLE 4

A printing plate prepared and imaged as the printing plate from example 2 was used to print on a AB Dick 360 press (trade name of AB Dick, USA) using K+E 800 ink (trade name of Kast und Ehinger) and water with 5% G 671c (silica containing fountain from Agfa-Gevaert, Belgium). Good prints were obtained, i.e. prints with good ink-uptake in the non-exposed areas and no scumming in the exposed areas.

What is claimed is:

1. A method for lithographic printing comprising the following steps:

preparing a lithographic printing plate without wet processing by image-wise laser exposing a heat-sensitive non-ablatable wasteless imaging element having on a support as top layer a heat sensitive image forming layer comprising a heat-switchable binder which layer becomes hydrophobic under the action of image-wise laser exposure;

mounting said printing element of the press prior to or after the exposure; and applying a fountain solution and ink, wherein said fountain solution comprises at least one water insoluble compound selected from the group consisting of silica, alumina, titanium oxide, tin oxide, china clay, smectic clay and zirconium oxide.

2. A method for lithographic printing according to claim 1 wherein said fountain solution further comprises at least one polymer selected from the group consisting of polymethacrylic acid or one of its salt, polyacrylic acid or one of its salt, polydextrane, polyvinylalcohol, polyvinylpyrrolidone, polyacrylamide, polyvinylsulphonic acid or one of its salts and gum arabic.

3. A method for lithographic printing according to claim 1 wherein said fountain solution is applied prior to inking the plate.

4. A method for lithographic printing according to claim 1 wherein said heat switchable binder comprises pendant hydrophilic groups which are converted under the action of heat to hydrophobic groups.

5. A method for lithographic printing according to claim 4 wherein said hydrophilic groups are selected from the group consisting of carboxylic acids, sulphonic acids, phosphonic acids and phenols or their salts.

6. A method for lithographic printing according to claim 5 wherein said heat-switchable binder having pendant hydrophilic groups is a (co)polymer containing monomeric units selected from the group consisting of maleic acid, fumaric acid, itaconic acid, 3- or 4-vinylphthalic acid, cis-1,2,3,6-tetrahydrophthalic acid, cis-5-norbene-endo-2,3-dicarboxylic acid and their half esters.

7. A method for lithographic printing according to claim 4 wherein said heat-switchable binder having pendant hydrophilic groups is a copolymer further containing monomeric units selected from the group consisting of vinyl methyl ether, ethene and styrene.

* * * * *